United States Patent [19]

Ronchi

[11] Patent Number: 4,749,591

[45] Date of Patent: Jun. 7, 1988

[54] DEVICE FOR MAKING METALLIZED PLASTIC FILMS WITH CLEARLY DEFINED NON-METALLIZED AREAS

[75] Inventor: Pietro Ronchi, Vimercate, Italy

[73] Assignee: Metalvuoto Films S.p.A., Bellusco, Italy

[21] Appl. No.: 31,070

[22] PCT Filed: Jun. 25, 1986

[86] PCT No.: PCT/EP86/00378

§ 371 Date: Apr. 23, 1987

§ 102(e) Date: Apr. 23, 1987

[87] PCT Pub. No.: WO87/00208

PCT Pub. Date: Jan. 15, 1987

[30] Foreign Application Priority Data

Jul. 3, 1985 [IT] Italy ..................... 21415 A/85

[51] Int. Cl.⁴ .................. B05D 5/12; C23C 14/00
[52] U.S. Cl. .................... 427/79; 427/250; 427/286; 427/424; 118/718; 118/315; 118/325
[58] Field of Search ............ 118/718, 315, 325; 427/79, 250, 286, 424

[56] References Cited

U.S. PATENT DOCUMENTS 4,022,928  5/1977  Piwcyzk .................. 427/43

FOREIGN PATENT DOCUMENTS 720709    4/1942  Fed. Rep. of Germany.
1263449   3/1968  Fed. Rep. of Germany.
1262732   3/1968  Fed. Rep. of Germany.
1521461   7/1969  Fed. Rep. of Germany.
2130195  11/1972  France.
55-79867  6/1980  Japan.

Primary Examiner—Richard R. Bueker
Attorney, Agent, or Firm—Young & Thompson

[57] ABSTRACT

Said device comprises among other things, a metallizing apparatus through which is made to pass the plastic film (15) whereon the metallizing layer is to be deposited, and a new oil-delivery unit (21) which deposits a layer of oil onto the areas of the film which are to remain non-metallized. The oil delivery unit (21) evaporator is positioned so that the thin layer of oil only adheres to the film in a clearly defined area. The oil has been selected with great care from those available for sale.

7 Claims, 3 Drawing Sheets

DEVICE FOR MAKING METALLIZED PLASTIC FILMS WITH CLEARLY DEFINED NON-METALLIZED AREAS

The subject of this invention is a device for making metallized plastic films with clearly defined non-metallized areas.

The metallizing of plastic films can be divided into two main branches: the metallizing of plastic films for electrical-electronic uses, mainly in condensers, and the metallizing of plastic films for flexible packaging.

In the first case, the metallized plastic film condenser is made up of two strips of film which form the condenser plates. These strips are obtained from a sheet 8, shown in FIG. 1, provided with a series of non-metallized parallel linear areas B, which extend along the whole length of the reel, and areas A where the metal is deposited.

The width of the non-metallized edges and the distance between them may vary according to the characteristics of the condenser. Normally the width 1 ranges from 0.7 mm to 10 mm, while the distance d between the strips B lies between 8.5 mm and 300 mm.

By suitably cutting said sheets at points corresponding to the areas B, the strips are obtained which are to be arranged separated from one another. This is achieved by leaving a non-metallized area, area B, on each of the plates, at corresponding zones thereof, along the entire length of the strip. An exemplary strip 9 is shown in FIG. 2.

In the case of metallized films for packaging non-metallized films are sometimes required so the content of the package can be seen. The non-metallized edges may be of any width. In this case the entire sheet in FIG. 1 is used.

In making strips for providing condenser plates, the metallized film must be produced with great care so as to obtain highly reliable electronic components.

According to a first technique, shown in FIG. 3, a masking with ring-welded tapes 16 of Kapton (registered trademark of Dupont) or Macrofol (registered trademark of Bayer), which adhere to the film and run in synchronicity therewith guided by rollers 17, is prearranged in a unit comprising a winding-off reel 10 and a winding-on reel 14 for the film 15, and a counteracting roller 12 whereon at least along a predetermined arc the film winds which is being subjected to the metal-evaporating source 18.

The advantage of non-metallized edges obtained using such an apparatus is that they always have a tollerance of about ±0.2 mm and a clear accurate borderline between the edge and the metal. Moreover, the film preserves its original colour and transparency. On the other hand, the tapes are subject to wear and breaking. Small aluminium particles come away therefrom and settle on the film, piercing and weakening the dielectric, which seriously damages the condenser.

In order to prevent the above-mentioned disadvantages, the use of a nozzle unit or oil evaporator is spreading, through which the heated and evaporated oil is delivered which deposits a small amount of fluid on the unmetallized film. Referring to FIG. 4, it can be seen that said oil-evaporator device 20 is positioned immediately before the evaporation source 18 for the metal to be deposited, in such a way that the film passes between the evaporator nozzle and the outer surface of the counteracting roller. Furthermore, according to the prior art, the nozzles on said oil-evaporator device are inserted into the body of the evaporator during assembly.

This method of obtaining said edge has the marked advantage that, as the tapes do not break, a greater production speed is achieved and the danger of aluminium vapours on the dielectric is completely eliminated. However, said method has some serious disadvantages: it is in fact difficult to accurately determine the size of the edge and, therefore, to calculate the condenser's effective capacitance. This is because, as can be seen in FIG. 5, the borderline between the edge B and the non-metallized area A has a transitional zone S which varies between 0.5 and 0.8 mm, as shown schematically in said FIG. 5. Moreover, under particular operating conditions of the condenser a phenomenon of metal destruction, generally aluminium, is triggered which causes said edge to be narrowed even by several millimeters. As a consequence the condenser suffers a sharp drop in capacitance and may stop working.

Lastly, since the oil in the evaporator tank is heated, it oxidizes and gives the edges a characteristic dark colouring.

Therefore, the object of this invention is to provide a device for obtaining lastic films with metallized surfaces whereon the border between the non-metallized edge and the adjacent area is clearly and accurately defined.

A further object is to provide the said border in such a way that it preserves its original colour and transparency.

The object is achieved by providing, in a device of the above-described type, a unit with a nozzle which is placed between the reel for winding off the film to be metallized and the counteracting roller of the metallizing device and in an area far from the supporting surface of said counter-acting roller.

According to a variation, the nozzles are prearranged in part of the unit which is slightly projecting relative to the rest thereof, such that the oil is evenly deposited onto the film.

According to an improvement, provision is made for said nozzles to consist of openings which are made in said evaporator device so as to be all at an equal distance from the film and provide an even deposit of oil.

A further improvement provides for the use of a particular type of oil which has, among other things, high thermal and chemical stability, is noninflammable and compatible with plastic over a wide range of temperatures; in particular, an oil has been chosen belonging to the family of oils which comprises carbon, oxygen and fluorine.

Further characteristics and advantages according to the invention are clearly apparent from the accompanying drawings, in which.

Figure 1:
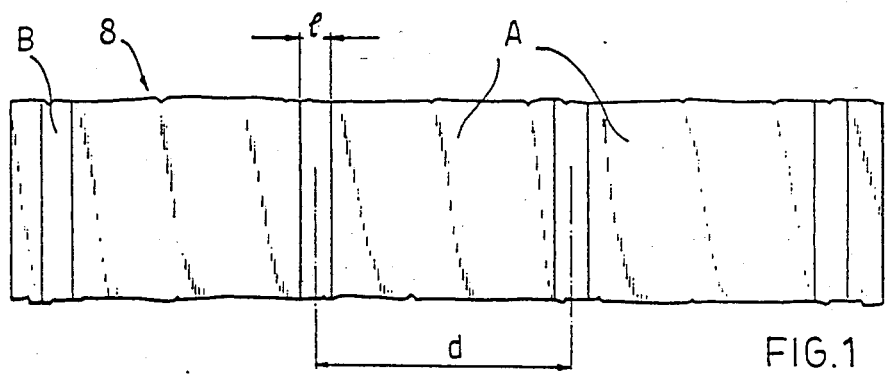
FIG. 1 represents the sheet with non-metallized areas used for obtaining the desired strip of material.
Figure 2:
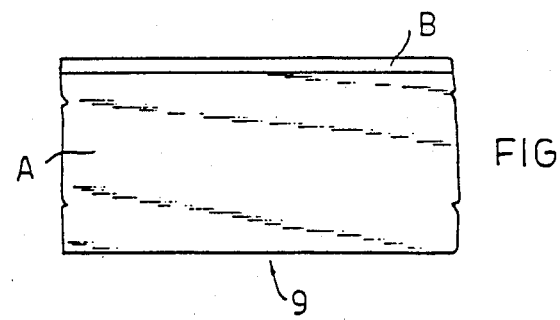
FIG. 2 represents an exemplary strip with non-metallized edge for making a condenser plate.
Figure 3:
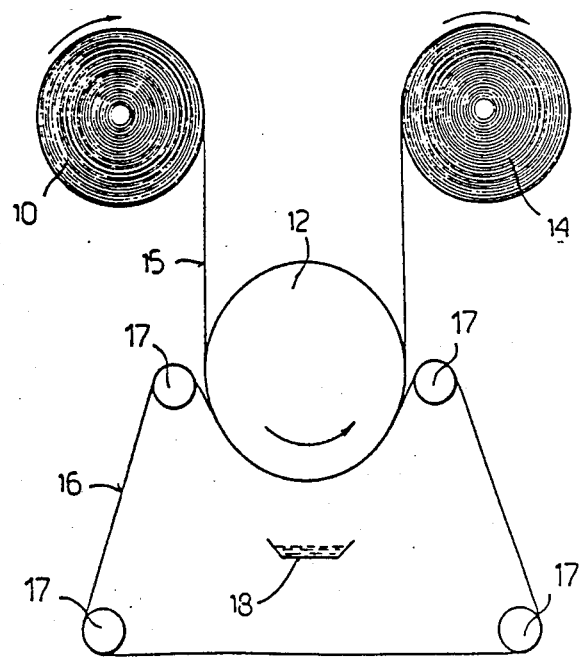
FIG. 3 represents a first type of apparatus for carrying out the metallizing according to the prior art.
Figure 4:
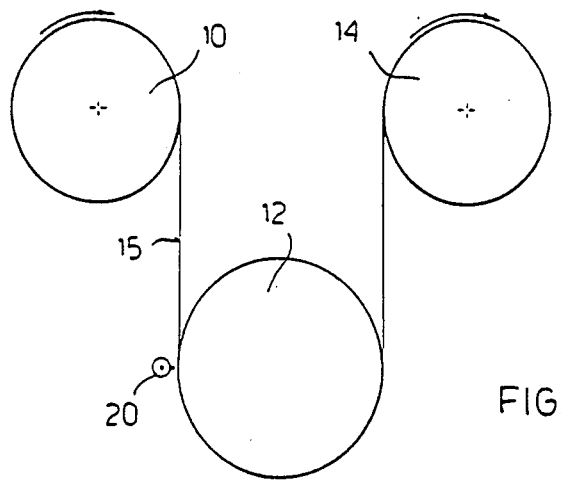
FIG. 4 represents a second type of apparatus for carrying out the metallizing according to the prior art.
Figure 5:
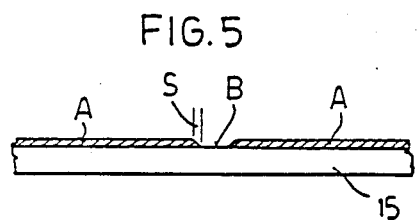
FIG. 5 represents in cross-section the areas on which the metal is deposited using the apparatus in FIG. 4.
Figure 6:
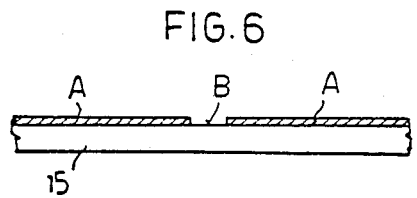
FIG. 6 represents in cross-section the sheet provided with metallized areas using the apparatus according to the invention.

In FIG. 6 a film 15 is shown in cross-section whereon a metallized layer A has been deposited; B is the non-metallized area and the transitional zone S is clearly and accurately defined.

Figure 7:
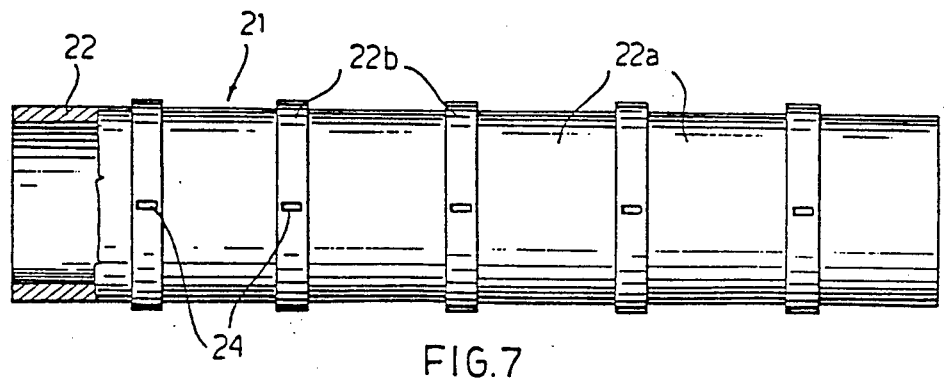
FIG. 7 represents an exemplary embodiment of a nozzle or evaporator element for discharging the oil.

The oil-delivery nozzle unit or oil evaporator 21 is shown in FIG. 7. It is made of a brass tube 22 with an overall length greater than the working width of the sheet. On said unit there are several rings 22b, slightly projecting relative to the adjacent areas 22a, which have evaporation openings or nozzles 24. The slightly projecting rings, which are shown in FIG. 7 with exaggerated projection for greater clarity, are obtained by reducing the external diameter of the tube 22. The slits 24 or holes form the nozzles for delivering the oil mist intended to protect the film from the aluminium vapours. The openings 24 embodied in FIG. 7 are basically rectangular.

Figure 8:
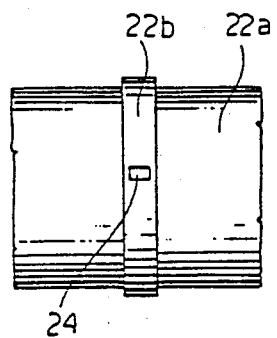
FIGS. 8 and 9 represent two variations of embodied nozzles.
Figure 9:
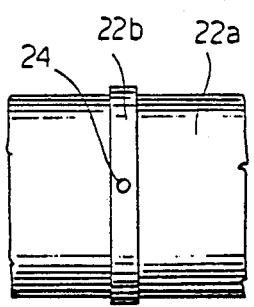

FIGS. 8 and 9 represent other variations of said openings; in particular FIG. 9 shows a circular hole with a diameter of about 2 mm. When the desired edge is to have a length greater than or equal to 3 mm, the openings consist of slits; when said edge B is to have a length less than 2 mm, they consist of holes.

Figure 10:
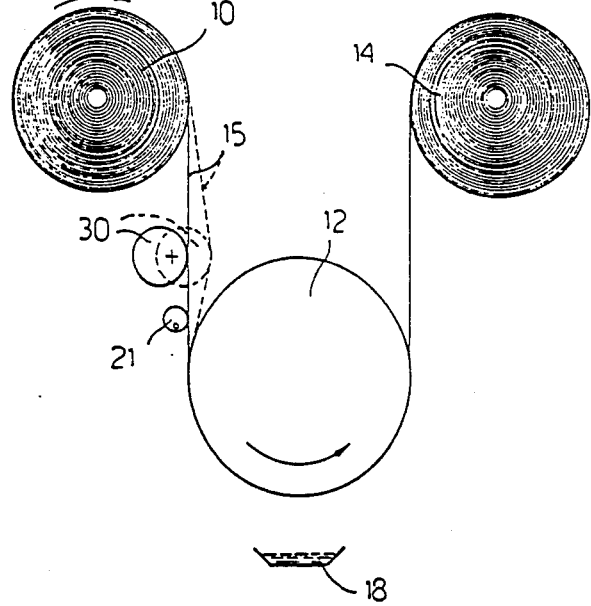
FIG. 10 is a schematic representation of the apparatus according to the invention.
Figure 11:
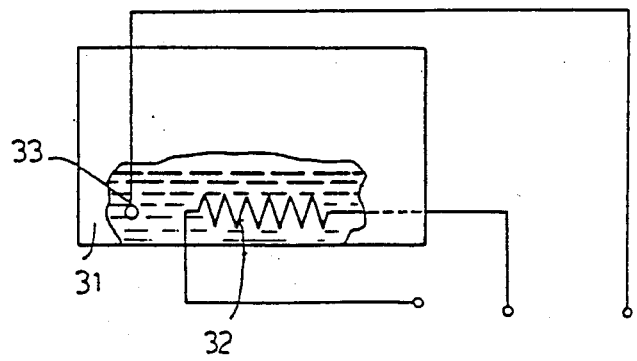
FIG. 11 represents a device for containing the oil according to the invention.

Said oil-delivery or evaporator unit 21 is situated in the device as shown in FIG. 10. It is positioned between the winding- on reel 10 and the counteracting roller 12, but at a point where there is no counteracting surface. In addition there is an eccentric roller 30 which holds the film taut. It is clearly apparent that, when the device is operating, the roller is in the position indicated by a continuous line; in this case the film will only adhere at the points corresponding to the projecting parts 22b; therefore, a thin layer of oil will be deposited on this area only, there being no counteracting surface.

The eccentric roller 30 can move from the position indicated in FIG. 10 by the continuous line to that indicated by the broken line, so as to withdraw the film away from the oil-delivery unit when the apparatus is not working. When being applied, the oil, brought to a temperature of between 80° and 200° C. according to the type of oil used, is delivered from the nozzles and settles on the film in clearly defined areas. During the metallizing stage the film runs at a speed of between 5 and 10 m/s, while the eccentric roller 30 is withdrawn to allow the film to brush the oiler. In this way no smudges occur on the border between the aluminium and the edge.

The oil is heated in a container 31 by means of a resistor 32, fed at 48 V a.c., with one pole to ground. It has been found by experiment that resistor dissipation, at the specified voltage and for 400 cc. of oil, is basically equal to the working width of the produced sheet. A thermostat 33, connected to the resistor circuit, keeps the temperature at around the optimum value for evaporating the oil.

According to the invention the selection of the type of oil to use is also especially important. An oil has been chosen from the family called Fomblin (trademark used by Montefluos) which comprises carbon, oxygen and fluorine, has a high chemical stability, high thermal stability and high density; is noninflammable; has a low surface tension; is only soluble using highly fluorinated solvents; has excellent lubricating and dielectric properties, low volatility and good compatibility with plastics, elastomers and metals over a wide range of temperatures; and has a high resistance to radiation and low toxicity. Of course, other oils with the same properties may be used.

The use of this oil allows the non-metallized layer to be made without undesiderable darkening on the plastic film.

What is climed is:

1. A process for making metallized plastic films with clearly defined non-metallized areas (B) by using a device comprising a first support (10) for winding off the film (15), a second support (14) for winding on the metallized film, between which at least one, counteracting roller (12) is provided for supporting the film when it faces the metallizing apparatus (18), and at least a unit (21) comprising at least a nozzle (24) for delivering a perfluoropolyether oil mist onto the areas intended to remain unmetallized of the film (15), wherein the unit (21) is positioned between the support (10) for winding off the film (15) and the counteracting support (12) at a point where the film is not supported on the side opposite to that from which the perfluoropolyether oil is delivered in such a way that the nozzle (24) adheres to the film (15), and wherein it comprises at least one eccentric roller (30), which can be selectively displaced so as to withdraw the film (15) from the oil-delivery unit (21) when the device is not operating or hold it close thereto when the metallizing layer is being deposited onto the film.

2. A process according to claim 1, characterized in that the perfluoropolyether oil is brought to a temperature of betewen 80° and 200° C.

3. A device for making metallized plastic film with clearly defined non-metallized areas (b), comprising a first support (10) for winding off the film (15), a second support (14) for winding on the metallized film, between which at least one counteracting roller (12) is provided for supporting the film when it faces the metallizing apparatus (18), and at least a unit (21) comprising at least a nozzle (24) for delivery a perfluoropolyether oil mist onto the areas intended to remain unmetallized of the film (15), wherein the unit (21) is positioned between the support (10) for winding off the film (15) and the counteracting support (12) at a point where the film is not supported on the side opposite to that from which the perfluoropolyether oil is delivered in such a way that the nozzle (24) adheres to the film (15) and wherein it comprises at least one eccentric roller (30), which can be selectively displaced so as to withdraw the film (15) from the oil-delivery unit (21) when the device is not operating or hold it close thereto when the metallizing layer is being deposited onto the film.

4. A device according to claim 3, characterized in that a part (22b) of the unit (21) comprising the nozzle (24) projects slightly with respect to the rest of said unit (21), so that only this part adheres to the film (15).

5. A device according to claim 3, characterized in that the nozzle (24) has a circular shape with a maximum diameter of 2 mm for areas (B) having a width of 2 mm.

6. A device according to claim 3, characterized in that the nozzle (24) has a rectangular shape for areas (B) having a width bigger than 2 mm.

7. A device according to claim 3, characterized in that it comprises a device for heating the oil so as to maintain it at a predetermined temperature.

* * * * *